United States Patent [19]

Nagashima et al.

[11] Patent Number: 5,419,924
[45] Date of Patent: May 30, 1995

[54] CHEMICAL VAPOR DEPOSITION METHOD AND APPARATUS THEREFORE

[75] Inventors: Makoto Nagashima, Tokyo; Hiroshi Nishizato, Chiba; Hirofumi Ono, Shiga, all of Japan

[73] Assignee: Applied Materials, Inc., Santa Clara, Calif.

[21] Appl. No.: 236,003

[22] Filed: May 2, 1994

Related U.S. Application Data

[63] Continuation of Ser. No. 912,024, Jul. 9, 1992, abandoned, which is a continuation of Ser. No. 626,274, Dec. 12, 1990, abandoned.

[30] Foreign Application Priority Data

Dec. 12, 1989 [JP] Japan .................. 1-322266

[51] Int. Cl.⁶ .............................................. C23C 16/00
[52] U.S. Cl. ................... 427/248.1; 427/255.1; 427/255.2; 118/726; 261/62; 261/44.3; 261/DIG. 65; 137/605; 392/396; 251/331
[58] Field of Search ............... 118/715, 726; 261/44.3, 261/62, DIG. 65; 137/605; 251/331; 427/248.1, 255.1, 255.2; 392/386, 394, 396

[56] References Cited

U.S. PATENT DOCUMENTS

| | | | |
|---|---|---|---|
| 1,352,316 | 9/1920 | Robinson | 261/44.3 |
| 1,421,627 | 7/1922 | Waterhouse | 261/44.3 |
| 1,444,222 | 2/1923 | Trego | 261/44.3 |
| 2,594,344 | 4/1952 | Pothier | 137/605 |
| 2,755,006 | 7/1956 | Small | 251/331 |
| 2,856,148 | 10/1958 | Heathcote | 251/331 |
| 2,934,314 | 4/1960 | Chambers | 251/331 |
| 3,190,262 | 6/1965 | Bakish | 118/719 |
| 3,698,367 | 10/1972 | Goodwin | 261/62 |
| 3,889,538 | 6/1975 | Fingerle | 392/397 |
| 3,930,908 | 1/1976 | Jolly | 118/715 |
| 4,232,063 | 11/1980 | Rosler et al. | 427/94 |
| 4,241,761 | 12/1980 | Miller | 251/331 |
| 4,558,845 | 12/1985 | Hunkapiller | 251/331 |
| 4,579,080 | 4/1986 | Martin et al. | 118/500 |
| 4,668,365 | 5/1987 | Foster et al. | 204/192.23 |
| 4,761,269 | 8/1988 | Conger et al. | 118/715 |
| 5,000,113 | 3/1991 | Wang et al. | 118/723 |
| 5,035,200 | 7/1991 | Moriyama et al. | 118/715 |
| 5,203,925 | 4/1993 | Shibuya | 118/726 |

FOREIGN PATENT DOCUMENTS

| | | | |
|---|---|---|---|
| 0058571 | 8/1982 | European Pat. Off. | |
| 713721 | 10/1931 | France | 261/44.3 |

*Primary Examiner*—Richard Bueker
*Attorney, Agent, or Firm*—Keiichi Nishimura

[57] ABSTRACT

Fixed amounts of a liquid source for a chemical vapor deposition process is supplied continuously from a source tank and through a liquid mass flow controller to a three-way valve. Inside the three-way valve, the liquid source is evaporated to generate a source gas by contacting a high-temperature carrier gas which flows therethrough and becomes mixed with the source gas. The gas mixture thus generated is supplied into a process chamber for a chemical vapor deposition process. The carrier gas may be heated by a gas heater before entering the three-way valve. Alternatively, the three-way valve may be enclosed inside a thermostatic container, the carrier gas being heated inside the container.

24 Claims, 5 Drawing Sheets

CHEMICAL VAPOR DEPOSITION METHOD AND APPARATUS THEREFORE

This is a continuation of U.S. application Ser. No. 07/912,024, filed Jul. 9, 1992, now abandoned, which is a continuation of Ser. No. 07/626,274 filed Dec. 12, 1990, now abandoned.

BACKGROUND OF THE INVENTION

This invention relates to chemical vapor deposition methods and apparatus therefor. More particularly, the invention relates to such methods and apparatus using a liquid source from which a source gas is generated.

In the past, source gases were used in most chemical vapor deposition methods because they are easy to handle and their flow can be controlled accurately. Methods of chemical vapor deposition by vaporizing a liquid source to generate a source gas, by contrast, have not been popular because it has not been easy to accurately supply a specified amount of the liquid source or to control the temperature of the supply piping. If it becomes possible to more precisely control the flow of a liquid source and hence to easily supply a source gas, however, the choice of available source materials will increase significantly and this may provide a partial answer to the ever increasing need for a method of forming thin films in the manufacture of finer and more highly integrated semiconductor devices.

Figure 8:
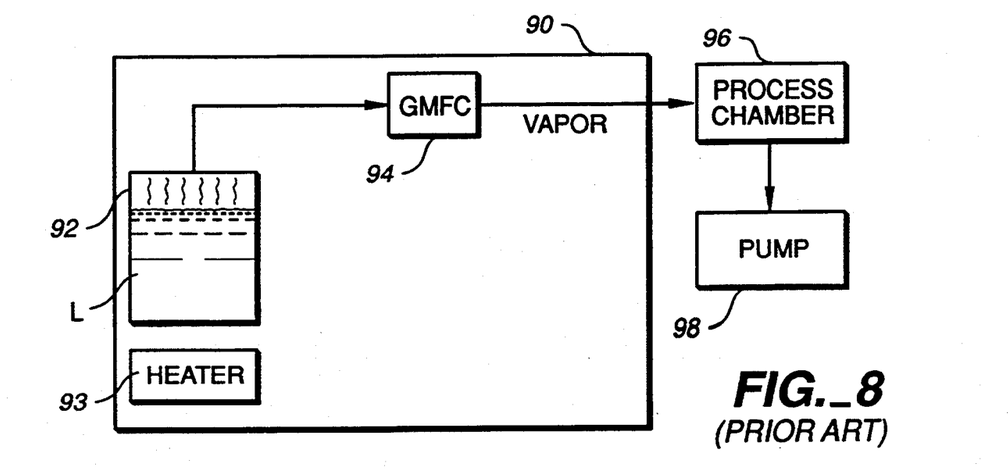
FIG. 8 is a schematic of a prior art chemical vapor deposition apparatus.

FIG. 8 shows schematically a prior art device for supplying a liquid source, characterized as having a source tank 92 and a gas mass flow controller (GMFC) 94 enclosed inside a thermostatic chamber 90, the gas mass flow controller 94 being connected to a process chamber 96 to which is also connected a vacuum pump 98. After a liquid source (L) is placed inside the source tank 92, it is heated by a heater 93 to generator a vapor and the generated vapor is supplied into the process chamber 96 with its flow rate controlled by the gas mass flow controller 94.

Figure 9:
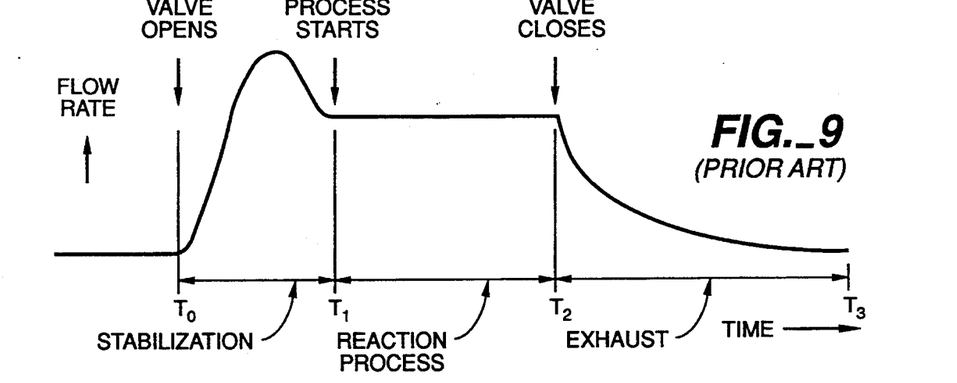
FIG. 9 is a graph schematically showing the changes in the flow rate of source gas in the prior art apparatus of FIG. 8.

A conventional device of this type has many disadvantages. Firstly, the device becomes large because many of its components must be enclosed inside a thermostatic chamber. This also tends to increase the cost of the device. Secondly, since the flow of a source gas evaporated by the heat from the heater must be controlled, and since a relatively large amount of high-temperature gas must be controlled by the gas mass flow controller, the device becomes large and expensive and its reliability is adversely affected as compared to the control of a liquid. Thirdly, thermal decomposition of the liquid source becomes likely when a high-temperature vapor is generated therefrom. Fourthly, since a vapor is generated in the source tank and the source gas thus generated is carried into the process chamber through the gas mass flow controller, the total gas flow path becomes inconveniently long. As shown in FIG. 9 and will be explained in detail below, this tends to increase the time for stabilizing the flow rate when the supply of the source is started (start-up) and when it is stopped (shut-down).

SUMMARY OF THE INVENTION

It is therefore an object of the present invention to eliminate the drawbacks of prior art apparatus of the type described above.

It is another object of the present invention to provide an improved method of chemical vapor deposition and an apparatus therefor which can use a liquid source such that the apparatus can be made compact, the flow of the liquid source can be precisely controlled, the start-up and shut-down times can be reduced when a gas source is supplied, many kinds of source materials can be freely mixed together and a variety of other advantages can be obtained.

According to a method by which the above and other objects can be accomplished, fixed amounts of liquid source are continuously supplied into an evaporator device for evaporating the received liquid source. For this purpose, the liquid source may be initially contained within an air-tight tank to which a liquid mass flow controller is connected. The liquid source may then be siphoned out of the tank by introducing an inert gas into the tank from above and the siphoned-out liquid source is directed to the evaporator device through the liquid mass flow controller. The evaporator may be a three-way valve with two inlets (a gas inlet and a liquid inlet for receiving a carrier gas and the liquid source, respectively) and an outlet connected to a process chamber inside which a chemical vapor deposition process is to take place. The three-way valve may be either "open" or "closed". When it is closed, a carrier gas flowing in through the gas inlet can pass therethrough to the outlet but the liquid source from the source tank is prevented from contacting the carrier gas. When the three-way valve is opened, the liquid source is permitted to come into contact with the carrier gas which continues to flow from the gas inlet to the outlet. The carrier gas is heated either by a gas heater before it is introduced into the three-way valve or inside the three-way valve itself if the three-way valve is enclosed inside a thermostatic container. The high-temperature carrier gas causes the liquid source to evaporate as they come into contact with each other, thereby generating a source gas for use in a chemical vapor deposition process. The source gas thus generated is mixed with the incoming carrier gas and the mixture is supplied into the process chamber for the chemical vapor deposition process. Since the flow rate of the liquid source introduced into the three-way valve is precisely controlled, the total amount of the source gas generated by evaporating the liquid source and supplied into the process chamber can also be precisely controlled. Since the carrier gas continues to flow through the three-way valve even after the three-way valve is closed at the end of the chemical vapor deposition process, the flow rate of the source gas is quickly dropped to zero at the end of the process.

BRIEF DESCRIPTION OF THE DRAWING

The accompanying drawings, which are incorporated in and form a part of the specification, illustrate embodiments of the present invention and serve to explain the principles of the invention. In the drawings.

DETAILED DESCRIPTION OF THE INVENTION

In what follows, the invention is described by way of illustrated embodiments.

Figure 1:
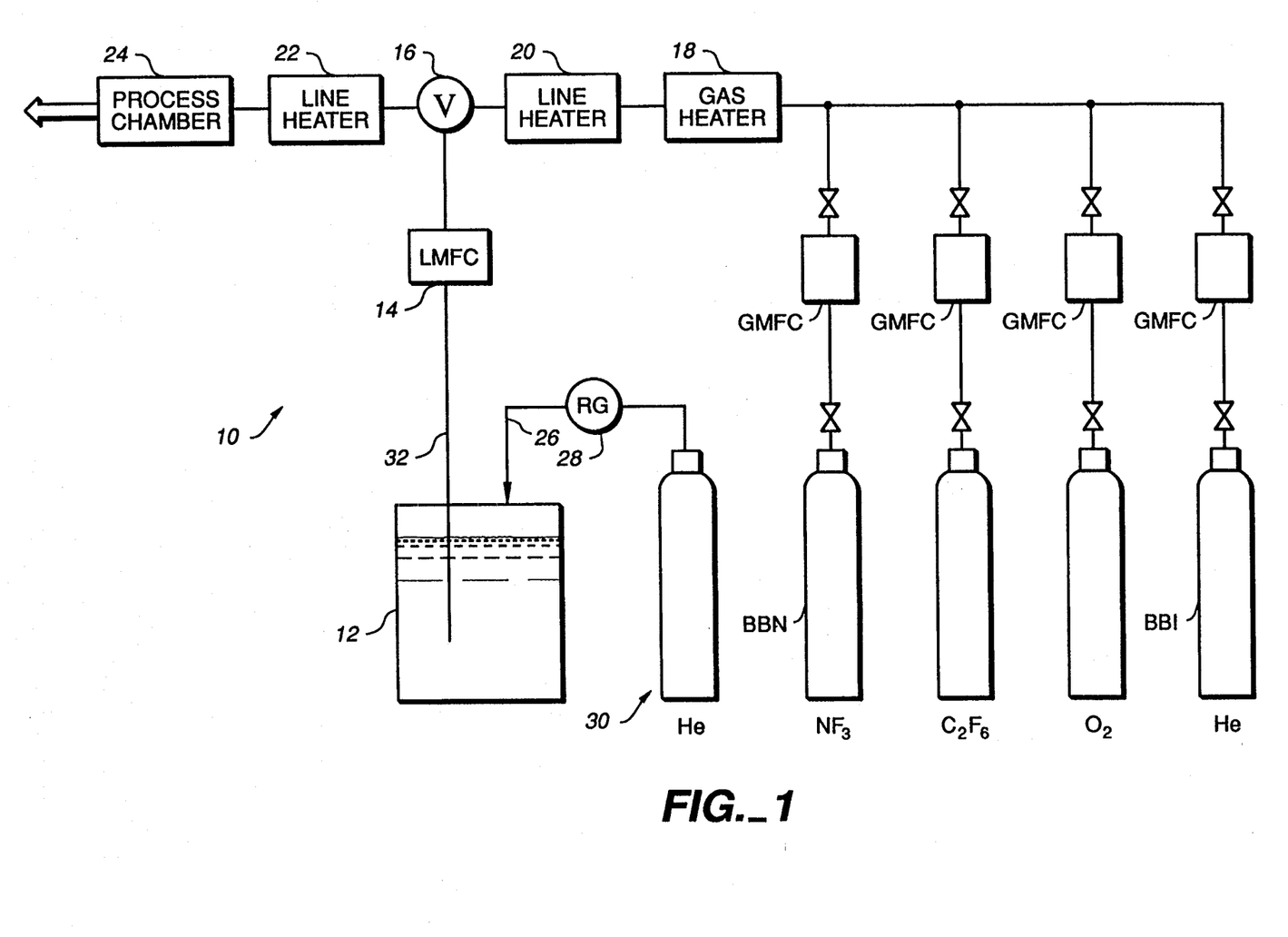
FIG. 1 is a schematic of a chemical vapor deposition apparatus embodying the present invention.

As shown in FIG. 1 which schematically illustrates a chemical vapor deposition apparatus according to one embodiment of the present invention, a vaporizer 10 is comprised of a source tank 12, a liquid mass flow controller (LMFC) 14, a three-way valve (V) 16, a gas heater 18 for heating a carrier gas to a specified temperature, and line heaters 20 and 22. One of the line heaters (20) is mounted between the gas heater 18 and the three-way valve 16 and the other of the line heaters (22) is mounted between the three-way valve 16 and a process chamber 24.

The source tank 12 contains therein a liquid source (L) such as tetraethyl orthosilicate (TEOS) in an airtight manner. An inert gas supply piping 26 provided with a gas flow regulator (RG) 28 is connected to the source tank 12, opening to its interior from above the surface of the liquid source (L) therein such that an inert gas such as helium can be introduced from a high-pressure gas storage tank 30 into the space inside the source tank 12 above the liquid source (L). When the inert gas is thus introduced into the source tank 12, the internal pressure in the space above the liquid source (L) is increased and the liquid source (L) is siphoned out and supplied to the liquid mass flow controller 14 through a liquid source supply piping 32 inserted from outside into the liquid source (L).

Figure 2:
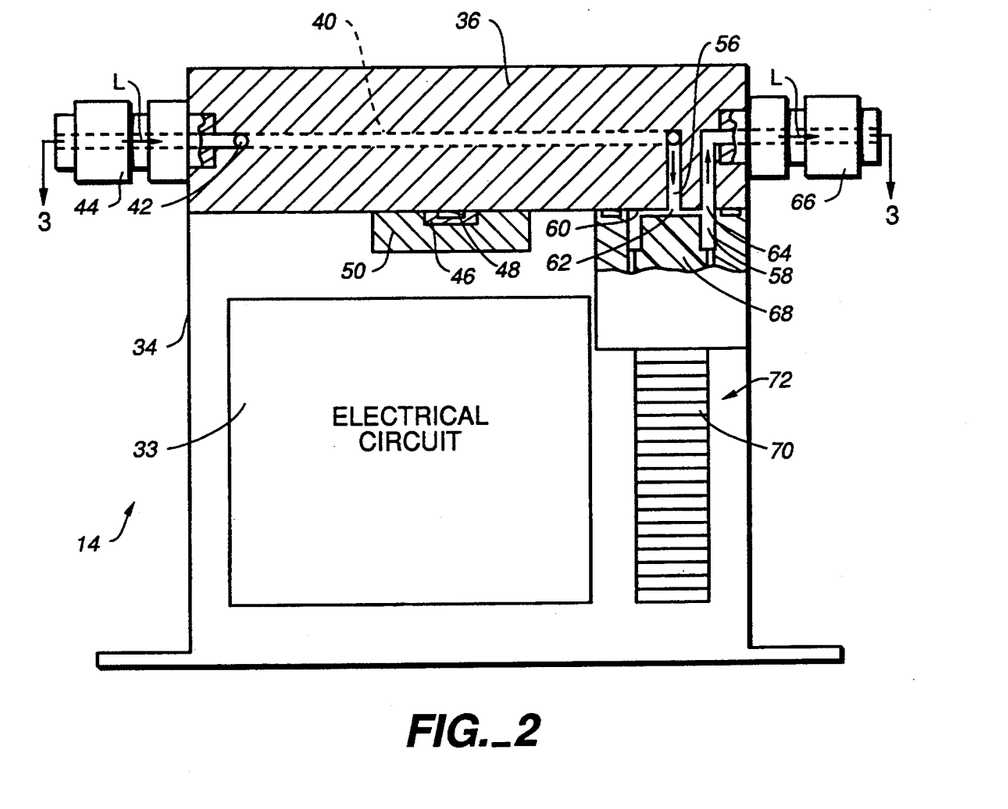
FIG. 2 is a vertical sectional view of the liquid mass flow controller in the apparatus shown in FIG. 1.
Figure 3:
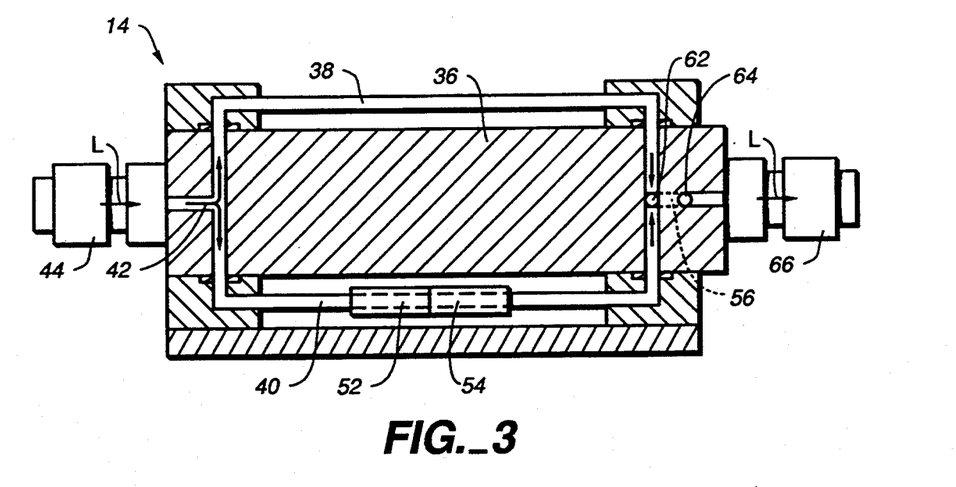
FIG. 3 is a horizontal sectional view of the liquid mass flow controller of FIG. 2 taken along the line 3—3 of FIG. 2.

As shown in FIGS. 2 and 3, the liquid mass flow controller 14 has an electrical circuit 33 for control purposes disposed nearly at the center of a casing 34. The electrical circuit 33 may be of a known type for a liquid mass flow controller and hence will not be specifically described herein. A generally planar body 36 of aluminum or stainless steel is mounted at the top of the casing 34 and, as can be seen more clearly in FIG. 3, a bypass tube 38 and a sensor tube 40 are provided so as to lie in a same horizontal plane. A branching pipe 42 connects, on one side, to upstream ends of both the bypass tube 38 and the sensor tube 40 and on the other side also to an inlet coupler 44 which is attached to one end of the body 36. The liquid source supply piping 32, which has its lower end immersed in the liquid source (L) inside the source tank 12 as shown in FIG. 1, has its upper end attached to this inlet coupler 44.

Mounted onto the bottom surface of the body 36 is a pair of resistors 46 and 48 for detecting the ambient temperature on the upstream and downstream sides, respectively, with respect to the direction of flow of the liquid source (L) across the body 36 as shown in FIG. 3. These resistors 46 and 48 are sandwiched between the bottom surface of the body 36 and a base plate 50 made of the same material as the body 36. These resistors 46 and 48 for detecting the ambient temperature use thin-film resistors having approximately the same resistance-temperature coefficient as thermal sensors 52 and 54 such that the temperature difference between the two resistors 46 and 48 can be maintained at a constant value independently of the changes in the ambient temperature.

The downstream ends of the bypass tube 38 and the sensor tube 40 are joined together to a downwardly leading tube 56 which is routed downward toward the bottom surface of the body 36 and leads to a valve chamber 58. A part of the bottom surface of the body 36 serves as a ceiling 60 of the valve chamber 58 provided with an inlet opening 62 through which the downwardly leading tube 56 opens to the valve chamber 58. The ceiling 60 of the valve chamber 58 is also provided with an outlet opening 64 through which the valve chamber is connected to an outlet coupler 66. The outlet coupler 66 is connected to the three-way valve 16 as shown in FIG. 1 such that the liquid source (L) can be supplied to the process chamber 24 with its mass flow precisely controlled.

A valve 68 is disposed inside the valve chamber 58 and adapted to move upward and downward according to the extending and contracting movement of a laminated piezoelectric actuator which serves as a driver 70 of a value control unit 72, thereby controlling the opening of the inlet opening 62.

Figure 4:
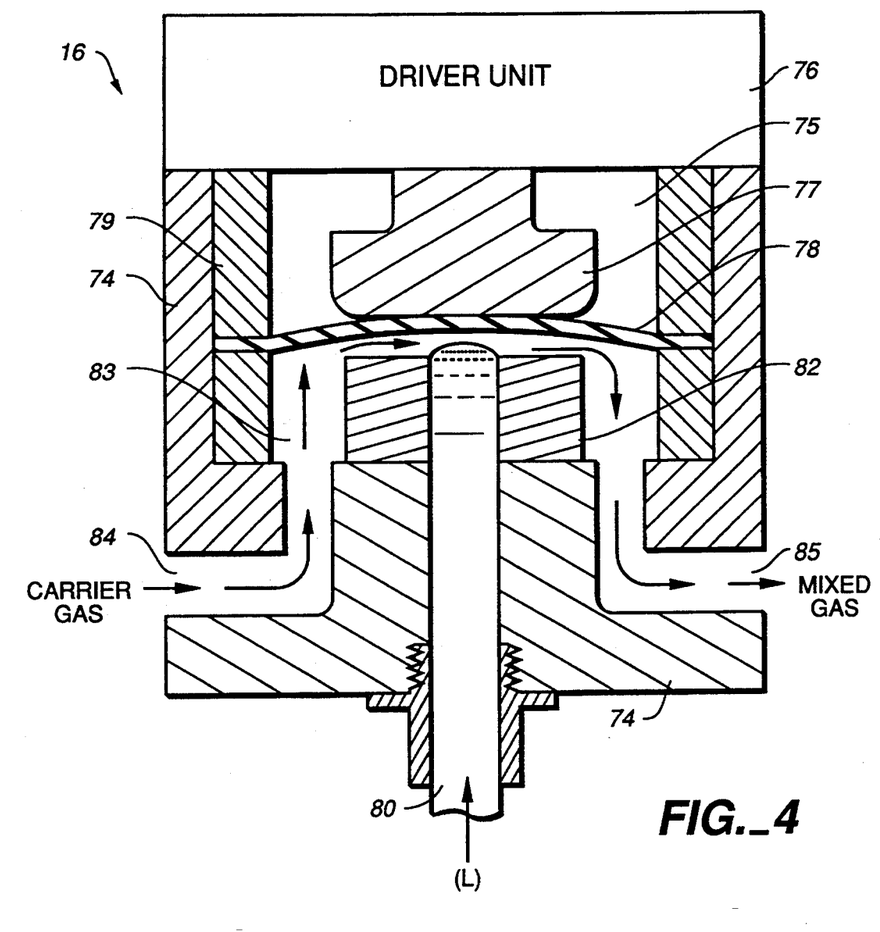
FIG. 4 is a vertical sectional view of the three-way valve in the apparatus shown in FIG. 1.

With reference next to FIG. 4 which shows the three-way valve 16 used as a part of the chemical vapor deposition apparatus 10 of present invention, a valve housing 74 has a concave ceiling part 75 and a driver unit 76 is disposed thereabove so as to close this concave ceiling part 75. This driver unit 76 of the three-way valve 16 may comprise, for example, an air valve capable of an accurate control. A downwardly protruding plunger 77 is attached to the center of the bottom surface of the driver unit 76 so as to be able to move vertically upward and downward by the operation of the driver unit 76. A diaphragm 78 is stretched and mounted at the center of the concave ceiling part 75, its peripheral edges being attached in an air-tight manner to an inner frame 79 mounted to the inner circumferential wall of the valve housing 74.

A liquid source inlet 80 is provided at the center of the bottom section of the valve housing 74 for introducing the liquid source (L) therethrough into the three-way valve 16. An annular valve seat 82 (a piece with a central opening) is provided as shown corresponding to the liquid source inlet 80 and opposite to the plunger 77 such that the plunger 77 can operate the diaphragm 78 to selectively open and close the central opening of the valve seat 82. The space around the valve seat 82 and below the diaphragm 78 serves as a control chamber 83. Formed on opposite sides of the liquid source inlet 80 are an L-shaped carrier gas inlet 84 and a similarly L-shaped mixed gas outlet 85, both connected to the control chamber 83 so as to together form a gas passage between the gas inlet 84 and the gas outlet 85. The liquid source inlet 80 is connected to the liquid mass flow controller 14, and the carrier gas inlet 84 is connected through the gas heater 18 and one of the line heaters (on the upstream side) 20 to high-pressure gas containers (BB1, . . . BBN) for a carrier gas and process gases, as shown schematically in FIG. 1. The mixed gas outlet 85 is connected to the process chamber 24 through the other one of the line heaters 22 (on the downstream side).

Use may be made of helium gas as the carrier gas but this choice is not intended to limit the scope of the invention. Oxygen, $C_2F_6$ and $NF_3$ may be used as process gases. These gases are contained individually in the high pressure containers (BB1, ... BBN) and can be selectively introduced through their respective gas mass flow controllers (GMFCs) into the three-way valve 16. In other words, one can control these gas mass flow controllers (GMFCs) to supply a desired mixture of these gases into the three-way valve 16.

Use as the process chamber 24 may be made, for example, of a reaction chamber of a known kind for manufacturing semiconductor devices.

With the chemical vapor deposition apparatus 10 thus formed, if an inert gas such as helium or nitrogen is introduced into the upper space inside the source tank 12, the pressure inside the tank 12 increases and the liquid source (L) is pushed out thereof and delivered into the liquid mass flow controller 14 where, as explained above, the valve control unit 72 is not influenced by the changes in ambient temperature and causes fixed amounts of the liquid source (L) to be supplied continuously into the three-way valve 16.

Figure 5:
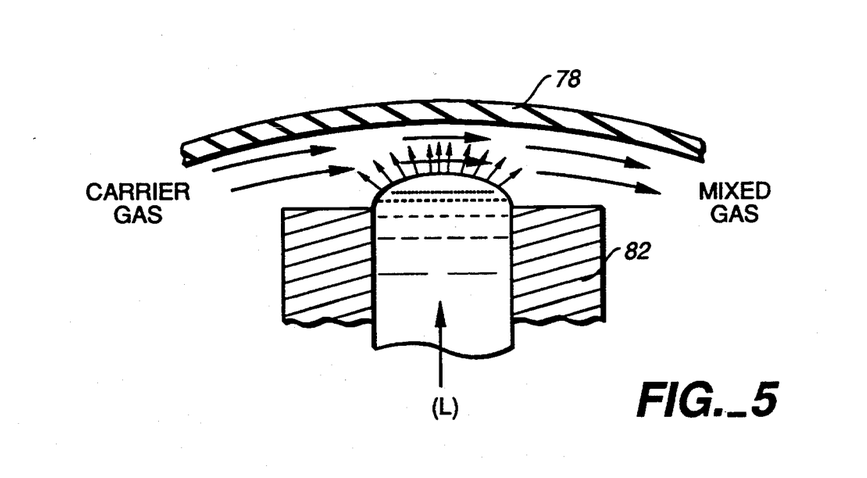
FIG. 5 is an enlarged portion of FIG. 5 to show the evaporation mechanism inside the three-way valve for generating the gas mixture.

As the liquid source (L) is thus delivered into the three-way valve 16, the liquid source (L) passes through the liquid source inlet 80 and wets the top surface of the valve seat 82. At the same time, the carrier gas and one or more of the process gases mixed thereto, which are heated to a high temperature, say, of 70° C., are introduced into the control chamber 83 of the three-way valve 16, thereby coming into contact with, heating and causing to evaporate the liquid source (L) wetting the top surface of the valve seat 82, thereby generating a source gas for chemical vapor deposition. At the same time, these gases are mixed together and a specified amount of this mixture of gases is then directed outward through the mixed gas outlet 85 into the process chamber 24. This evaporation process is shown more clearly in FIG. 5.

A substrate to be processed (not shown), such as a silicon wafer, may be kept at a high temperature inside the process chamber 24. The evaporated process gas including, for example, TEOS and oxygen and the carrier gas are passed over the substrate, thereby causing the following chemical reaction on the substrate surface to deposit $SiO_2$ thereon:

$Si(OC_2H_5)_4 + 14O_2 \rightarrow SiO_2 + 8CO_2 + 10H_2O$.

RF power may be applied at this time to the substrate to enhance the deposition rate. Reaction by-products generated inside the process chamber 24, as well as the un-reacted process gas and the carrier gas, are discharged from the interior of the process chamber 24 through an exhaust system (not shown).

To explain more in detail the evaporation mechanism inside the three-way valve 16, the liquid source (L) which has reached the top surface of the valve seat 82 comes into contact with the heated carrier gas and is thereby heated and sequentially evaporated from the surface. The vapor thus generated (which serves as the source gas) is carried away by the carrier gas as soon as it is generated such that the partial pressure of this source gas drops immediately. This drop in the partial pressure has the effect of causing further evaporation of the liquid source (L). Through this series of events, the liquid source (L) is evaporated and transported continuously and smoothly, and the source gas is supplied into the process chamber 24 at a constant flow rate.

Figure 6:
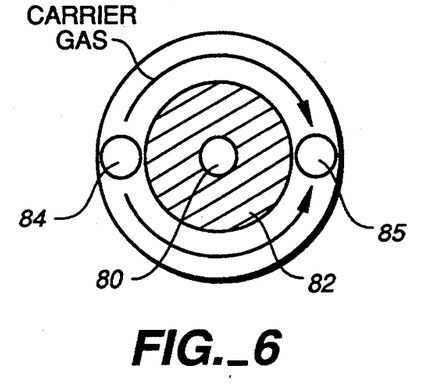
FIG. 6 is a horizontal sectional view of a region around the valve seat of the three-way valve when the valve seat is closed.
Figure 7:
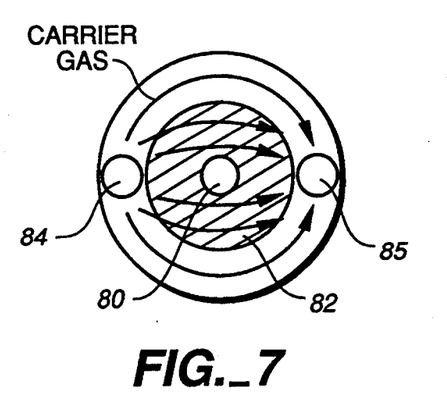
FIG. 7 is another horizontal sectional view of the same region around the valve seat of the three-way valve shown in FIG. 6 when the valve seat is open.

The flows of gas inside the three-way valve 16 are explained next with reference to FIGS. 6 and 7. When the valve seat 82 is closed with the plunger 77 pressing the diaphragm 78 against the top surface thereof, only the carrier gas flows around the valve seat 82 as shown by the arrows in FIG. 6. When the valve seat 82 is open, the gas flows not only around but also above the top surface of the valve seat 82 as shown by the arrows in FIG. 7 to carry away the source gas.

Figure 10:
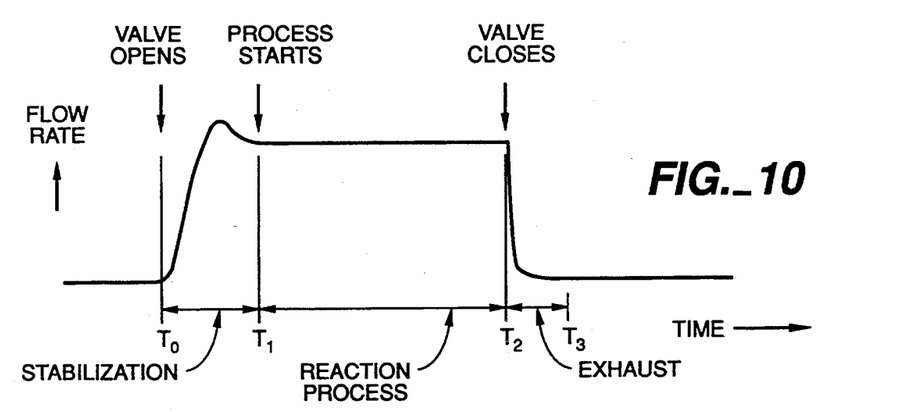
FIG. 10 is a graph schematically showing the changes in the flow rate of source gas in the apparatus of FIG. 1 embodying the present invention.

The prior art apparatus of FIG. 8 and the apparatus 10 embodying the present invention are compared next with reference to FIGS. 9 and 10 which schematically show the changes in the flow rate of source gas in the prior art apparatus of FIG. 8 and the apparatus 10, respectively. In both FIGS. 9 and 10, $t_0$ indicates the time when the valve of the gas mass flow controller is opened, $t_1$ indicates the time when the reaction process starts in the process chamber, $t_2$ indicates the time when the valve closes and the reaction process ends, and $t_3$ indicates the end of the exhaust process. The flow rate stabilizes during the period between $t_0$ and $t_1$. This period is referred to as the stabilization period for the purpose of reference.

The prior art apparatus of FIG. 8 is characterized, as mentioned above, as having a very long gas flow path because the liquid source (L) is evaporated by heating the source tank 92 and the flow rate of the source gas thus generated is controlled by the control valve of the gas mass flow controller 94. As a result, it takes a relatively long time (between $t_0$ and $t_1$ of FIG. 9) for the flow rate to stabilize after the valve is opened (at $t_0$). When the supply of the source is stopped (at $t_2$), the source gas still remains within the long gas flow path between the control valve and the process chamber and it again takes a relatively long time (between $t_2$ and $t_3$) for the flow rate to drop to zero. In other words, the time required for the entire process from the beginning to the end becomes long.

With the apparatus 10 embodying the present invention, by contrast, the three-way valve 16 directly opens and closes the exposed surface of the liquid source (L) as shown in FIG. 4 and this effectively shortens the gas flow path to the process chamber 24. As a result, the aforementioned stabilization period (from $t_0$ to $t_1$) at the start-up time becomes about ½ of that required in the case of a prior art apparatus (as can be seen from FIGS. 9 and 10). Since the carrier gas keeps flowing even after the three-way valve 16 is closed, as shown in FIG. 6, the amount of the source gas remaining in the gas flow path diminished rapidly, as shown in FIG. 10, after the three-way valve 16 is closed (at $t_2$ at the end of a reaction process). The time required for the exhaust (from $t_2$ to $t_3$) at the shut-down time becomes about 1/10 of that with a prior art apparatus, as schematically shown in FIGS. 9 and 10. In summary, the time required for the processing as a whole (from $t_0$ to $t_3$) can be reduced by using an apparatus according to the present invention.

Figure 11:
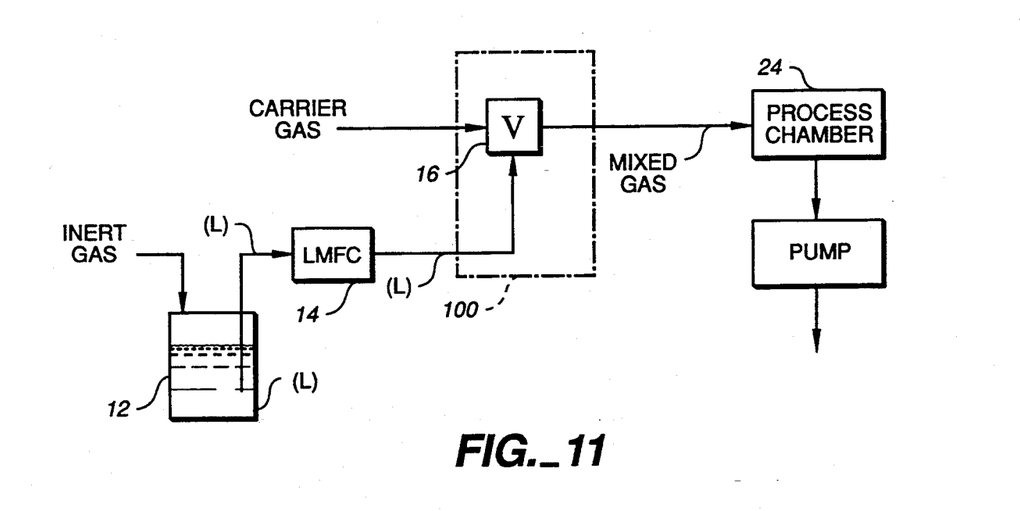
FIG. 11 is a schematic of another chemical vapor deposition apparatus embodying the present invention.

The foregoing description of a preferred embodiment of the invention has been presented for purposes of illustration. It is not intended to be exhaustive or to limit the invention to the precise form disclosed, and obviously many modifications and variations are possible in light of the above teaching. Another chemical vapor deposition apparatus also embodying the present invention is schematically illustrated in FIG. 11 wherein those components which are similar or equivalent to those shown in FIG. 1 are indicated for convenience by the same numerals. The apparatus shown in FIG. 11 is characterized as, and distinguishable from the one described above by way of FIG. 1 for, having a thermostatic chamber 100 to enclose the three-way valve 16 instead of using the gas heater 18 and the line heaters 20 and 22. The liquid source (L) is evaporated in this example by the heat from the three-way valve 16.

In summary, the distance between where the liquid source is vaporized and where the processing takes place (the process chamber 24) can be reduced significantly according to the present invention such that the start-up and shut-down times as defined above can be made extremely short. Since the time required for the exhaust is short, in particular, effects of contamination can be reduced when a different source gas is used in a next process. As a result of the shortened process times, productivity of the apparatus can be improved and since the liquid source is supplied at normal temperature, thermal decomposition of the liquid source can be prevented. Use may be made of mixtures of various liquid sources. Apparatus according to the present invention, furthermore, can be made compact because there is no need for a large thermostatic container for enclosing substantially the entire system. This has the favorable consequences of reducing the cost and making the maintenance easier. The process chamber can also be used both for low-pressure (and vacuum) and high-pressure applications.

What is claimed is:

1. In a chemical vapor deposition method, the improvement wherein said method includes the steps of:
   supplying a liquid source into a three-way valve having a passageway therethrough;
   supplying a carrier gas so as to flow through said passageway, whereby the flowing carrier gas promotes vaporization of the liquid source, and whereby the carrier gas entrains the vaporized source so as to produce a gas mixture; and
   supplying said gas mixture into a reaction region.

2. The method of claim 1 further comprising the step of moving a diaphragm which abuts said passageway to thereby selectably allow or disallow said liquid source to enter said passageway.

3. The method of claim 1 further comprising the steps of heating said carrier gas outside said three-way valve and causing said heated carrier gas to come into contact with said liquid source in said passageway.

4. The method of claim 1 wherein said three-way valve has a valve head exposed to said vaporization region and said liquid source is introduced into said vaporization region so as to wet said valve head.
   supplying said gas mixture into a reaction region.

5. The method of claim 1 wherein said liquid source is continuously supplied at a fixed rate into said three-way valve.

6. The method of claim 5 further comprising the step of pumping a diaphragm which abuts said passageway to thereby selectably allow or disallow said liquid source to enter said passageway.

7. The method of claim 5 further comprising the steps of heating said carrier gas outside said three-way valve and causing said heated carrier gas to come into contact with said liquid source in said passageway.

8. The method of claim 5 wherein said three-way valve has a valve head exposed to said vaporization region and said liquid source is introduced into said vaporization region so as to wet said valve head.

9. A chemical vapor deposition method comprising the steps of:
   providing a three-way valve inside a thermostatic chamber, said three-way valve having a passageway therethrough;
   supplying a liquid source into said passageway;
   vaporizing said liquid source to generate a source gas inside said passageway;
   producing a gas mixture by mixing said source gas with a carrier gas; and
   supplying said gas mixture into a reaction region.

10. The method of claim 9 further comprising the step of moving a diaphragm which abuts said passageway to thereby selectably allow or disallow said liquid source to enter said passageway.

11. The method of claim 9 wherein said three-way valve has a valve head exposed to said vaporization region and said liquid source is introduced into said vaporization region so as to wet said valve head.

12. The method of claim 9 wherein fixed amounts of said liquid source are continuously supplied into said three-way valve.

13. The method of claim 12 further comprising the step of moving a diaphragm which abuts said passageway to thereby selectably allow or disallow said liquid source to enter said passageway.

14. The method of claim 12 wherein said three-way valve has a valve head exposed to said vaporization region and said liquid source is introduced into said vaporization region so as to wet said valve head.

15. A chemical vapor deposition apparatus comprising:
   a process chamber;
   liquid supplying means for supplying fixed amounts of a liquid source; and
   a three-way valve means connected to said process chamber and said liquid supplying means for receiving a high-temperature carrier gas and a specified amount of said liquid source, for causing said liquid source to contact said carrier gas to evaporate a specified amount of said liquid source and to thereby generate a source gas, for generating a gas mixture by mixing said source gas with said carrier gas, and for directing said gas mixture into said process chamber;
   said three-way valve means being capable of selectively assuming an open position or a closed position, said liquid source evaporating and mixing with said carrier gas when said three-way valve assumes said open position and said carrier gas continuing to flow through said three-way valve into said process chamber when said three-way valve assumes said closed position;
   said three-way valve means comprising:
   a housing having a liquid inlet, a gas inlet and a gas outlet, said liquid inlet being connected to said liquid supplying means, a passageway inside said housing and connecting said gas inlet with said gas outlet;
   an annular valve seat having a top surface exposed to said passageway, said top surface having a central hole such that a liquid entering said housing through said liquid inlet passes through said annular valve seat and reaches said top surface;

a diaphragm disposed above and opposite said top surface; and driving means for selectively pressing said diaphragm against said top surface of said annular valve seat so as to close said central hole or removing said diaphragm away from said top surface of said annular valve seat so as to open said central hole.

16. The chemical vapor deposition apparatus of claim 15 wherein said liquid supplying means include a source tank containing said liquid source, and a liquid mass flow controller for receiving said liquid source from said source tank and continuously providing fixed amounts of said liquid source to said three-way valve.

17. A valve for use in chemical vapor apparatus for mixing a reactant with a carrier gas for transportation to a reaction chamber, comprising:

a valve body defining a mixing chamber, a reactant inlet having an end opening into said mixing chamber and connected via a first channel through said valve body to a reactant port on the outside of said valve body to admit a reactant in liquid form to said mixing chamber, a carrier gas inlet in said mixing chamber connected via a second channel through said valve body to a carrier gas port on the outside of said valve body, a reactant/carrier outlet in said mixing chamber connected via a third channel through said valve body to a reactant/carrier port on the outside of said valve body, a valve closure positioned across and proximate to the end of said reactant inlet, and an actuator for moving said valve closure to engage the interior of said mixing chamber surrounding said end of the reactant inlet to block flow of reactant only from said reactant inlet but to allow carrier gas to flow from the carrier gas inlet through the mixing chamber to the reactant/carrier outlet.

18. The valve of claim 17 wherein said carrier gas inlet and said reactant/carrier outlet are positioned on opposite sides of said reactant inlet so that carrier gas flowing from said carrier gas inlet to said vapor/carrier outlet flows past said reactant inlet when the valve closure is spaced from the reactant inlet.

19. The valve of claim 17 wherein said valve closure is a diaphragm positioned over said reactant inlet, and said actuator is a plunger for moving said diaphragm to engage or disengage an interior surface of said mixing chamber in an area surrounding said reactant inlet.

20. A vaporizer for use in chemical vapor apparatus for vaporizing reactant liquid and mixing said liquid with a carrier gas for transportation to a reaction chamber, comprising:

a body defining a mixing chamber, a liquid inlet having an end opening into said mixing chamber and connected via a first channel through a valve body to a liquid port on the outside of said body, a carrier gas inlet in said mixing chamber connected via a second channel through said body to a carrier gas port on the outside of said body, a vapor/carrier outlet in said mixing chamber connected via a third channel through said body to a vapor/carrier port on the outside of said body, wherein said reactant liquid is carried from said liquid port through said first channel to said mixing chamber via said liquid inlet, and in said mixing chamber said reactant liquid is vaporized and mixed with said carrier gas, and the mixture of vaporized liquid and carrier gas is exhausted from said mixing chamber via said vapor/carrier outlet, and a valve movable between an open position spaced from said end of the liquid inlet in which at least some of the carrier gas is permitted to flow over the end of the liquid inlet and vaporize the reactant liquid, and a closed position over and covering said end of the liquid inlet to prevent the flow of the carrier gas over the reactant liquid but to allow the flow of the carrier gas to the vapor/carrier outlet.

21. The vaporizer of claim 20 wherein said carrier gas inlet and said vapor/carrier outlet are positioned on opposite sides of said liquid inlet, so that carrier gas flowing from said carrier gas inlet to said vapor/carrier outlet flows past said liquid inlet.

22. The vaporizer of claim 21 including means for heating said carrier gas to a temperature substantially above that of said reactant liquid.

23. The vaporizer of claim 20 in which the valve means comprises:

a valve closure positioned proximate to said end of the liquid inlet, and an actuator for moving said valve closure to engage the interior of said mixing chamber surrounding said end of the liquid inlet to block flow of liquid from said liquid inlet.

24. The vaporizer of claim 23 wherein said valve closure is a diaphragm positioned over said liquid inlet, and said actuator is a plunger for moving said diaphragm to engage or disengage an interior surface of said mixing chamber surrounding said liquid inlet.

* * * * *